(12) United States Patent
Shimada

(10) Patent No.: US 11,644,920 B2
(45) Date of Patent: May 9, 2023

(54) CAPACITANCE DETECTION CIRCUIT AND INPUT DEVICE

(71) Applicant: ROHM CO., LTD., Kyoto (JP)

(72) Inventor: Yuji Shimada, Kyoto (JP)

(73) Assignee: ROHM CO., LTD., Koyoto (JP)

( * ) Notice: Subject to any disclaimer, the term of this patent is extended or adjusted under 35 U.S.C. 154(b) by 0 days.

(21) Appl. No.: 17/211,170

(22) Filed: Mar. 24, 2021

(65) Prior Publication Data

US 2021/0303097 A1 Sep. 30, 2021

(30) Foreign Application Priority Data

Mar. 27, 2020 (JP) .............................. JP2020-057686

(51) Int. Cl.
*G06F 3/041* (2006.01)
*H03K 17/96* (2006.01)
*G01D 5/24* (2006.01)
*G06F 3/044* (2006.01)

(52) U.S. Cl.
CPC .............. *G06F 3/0416* (2013.01); *G01D 5/24* (2013.01); *G06F 3/044* (2013.01); *H03K 17/962* (2013.01); *H03K 2217/9607* (2013.01)

(58) Field of Classification Search
None
See application file for complete search history.

(56) References Cited

U.S. PATENT DOCUMENTS

| | | | | |
|---|---|---|---|---|
| 2012/0274340 A1* | 11/2012 | Yang | ...................... | G01R 17/02 |
| | | | | 324/680 |
| 2014/0035601 A1* | 2/2014 | Fujiyoshi | ............ | G06F 3/04182 |
| | | | | 324/684 |
| 2015/0180493 A1* | 6/2015 | Liu | .......................... | H02M 3/06 |
| | | | | 324/686 |
| 2020/0194435 A1* | 6/2020 | Lilak | .................... | H01L 29/4908 |
| 2021/0034178 A1* | 2/2021 | Jiang | ..................... | G06F 3/0416 |

FOREIGN PATENT DOCUMENTS

| | | |
|---|---|---|
| JP | 2014045475 A | 3/2014 |
| JP | 2015132506 A | 7/2015 |

* cited by examiner

*Primary Examiner* — Christopher R Lamb
(74) *Attorney, Agent, or Firm* — Cantor Colburn LLP

(57) ABSTRACT

The present disclosure provides a capacitance detection circuit capable of reducing a chip area. The present disclosure relates to a capacitance detection circuit and an input device. A sense pin of the capacitance detection circuit is connected to a sensor electrode. A first driving unit applies a high voltage or a low voltage to the sense pin. A second driving unit applies the high voltage or the low voltage to a first terminal of a reference capacitor. A third driving unit applies the high voltage or the low voltage to a second terminal of the reference capacitor. A first switch is disposed between the sense pin and the first terminal of the reference capacitor. A second switch is disposed between an input of a post-stage circuit block and the first terminal of the reference capacitor.

8 Claims, 12 Drawing Sheets

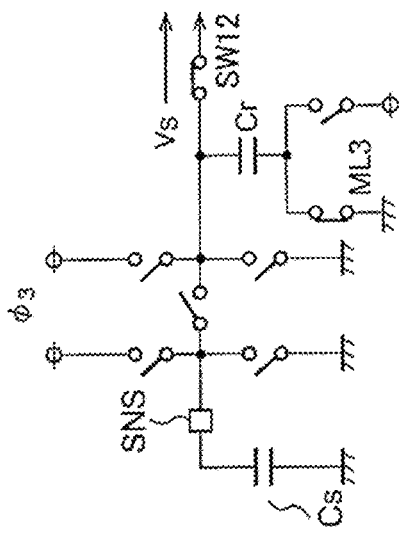
FIG.3A
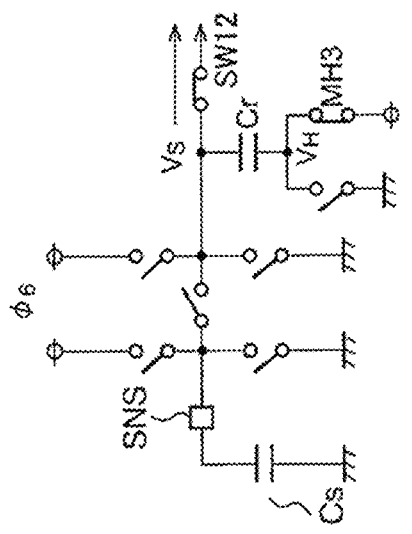
FIG.3D
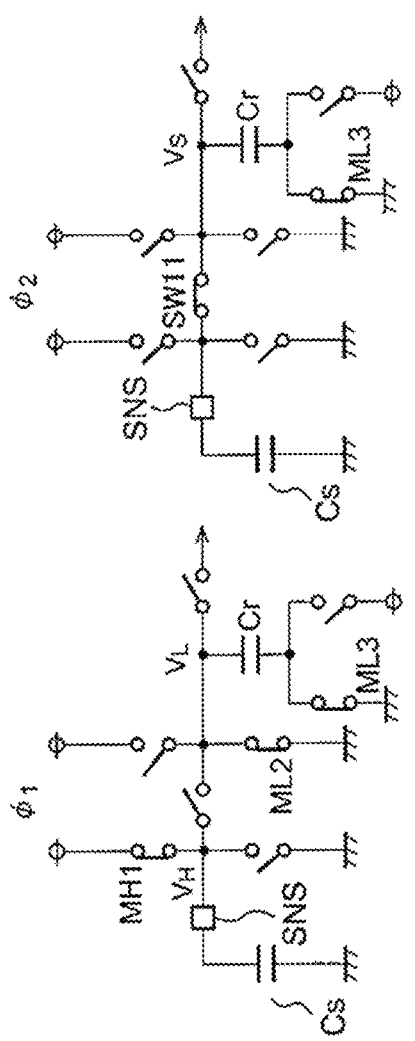
FIG.3B
FIG.3C
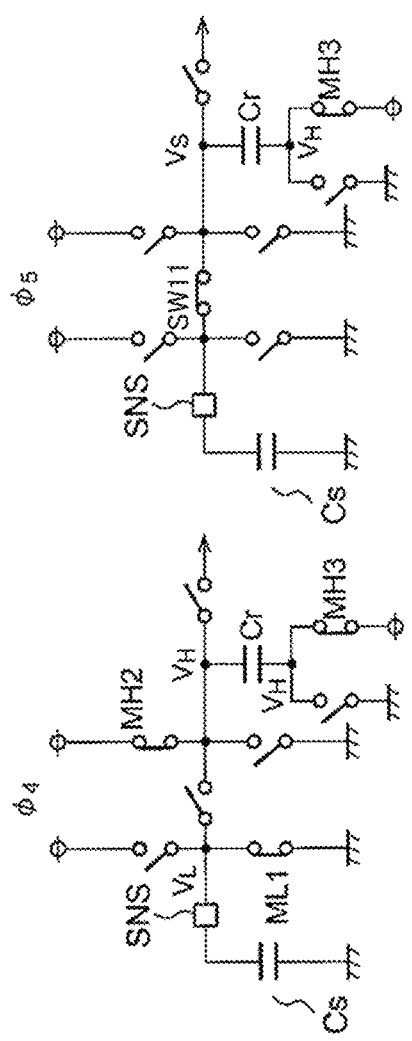
FIG.3E
FIG.3F

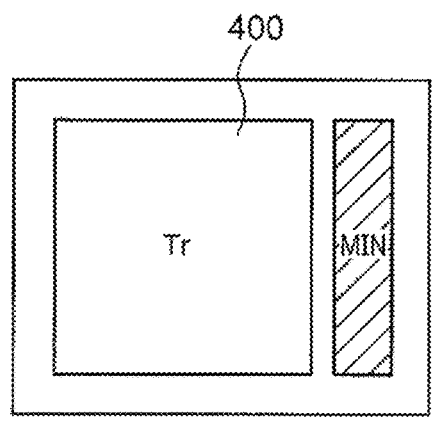
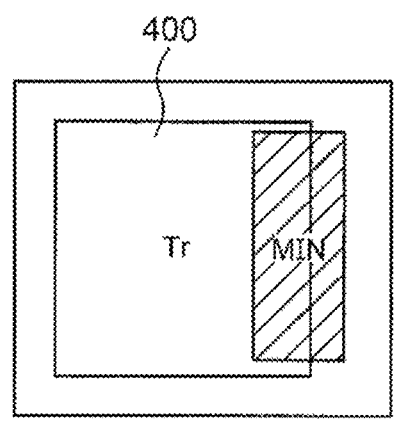
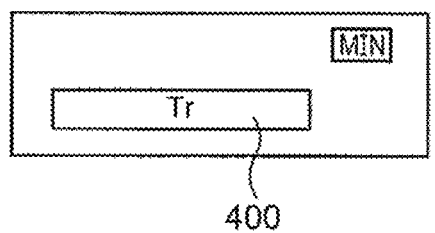
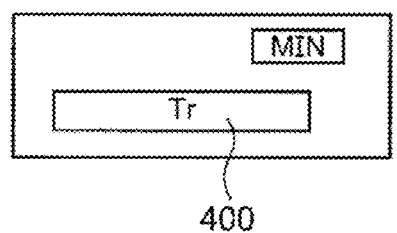
FIG.11A  FIG.11B

CAPACITANCE DETECTION CIRCUIT AND INPUT DEVICE

CROSS REFERENCE TO RELATED APPLICATIONS

The present invention claims priority under 35 U.S.C. § 119 to Japanese Patent Application No. 2020-057686 filed on Mar. 27, 2020, the entire content of which is incorporated herein by reference.

BACKGROUND FIELD

The field relates to a capacitance detection circuit for an electrostatic capacitance.

DESCRIPTION OF THE PRIOR ART

In recent years, touch type input devices are provided in electronic apparatuses such as computers, smartphones, tablet terminals and portable audio devices to serve as user interfaces. Known touch type input devices include touchpads and pointing device that perform various inputs by contacting or approaching of a finger or a stylus.

Touch type input devices are substantially divided into resistive film type and electrostatic capacitance type. In the electrostatic capacitance type, a plurality of sensor electrodes convert electrostatic capacitances (referred to as a capacitance below) generated by a user input to electrical signals so as to detect the presence or absence of a user input and coordinate position thereof.

Methods for detecting the electrostatic capacitance are substantially divided into self-capacitance type and mutual capacitance type. The self-capacitance type has extremely high sensitivity, and is capable of detecting touch operation as well as finger approach. However, the self-capacitance type suffers issues of being incapable of distinguishing waterdrops from touching or detecting a two-point touch. On the other hand, the mutual capacitance type features advantages of capabilities for detecting a two-point touch (or a multi-point touch of more than two points), and is less likely affected by waterdrops. Thus, either one or both of the self-capacitance type and the mutual capacitance type can be selected according to an intended purpose.

FIG. 1 shows a block diagram of a comparative embodiment of touch type input device 10 of the self-capacitance type. The touch type input device 10 includes a touch panel 12 and a capacitance detection circuit 20. The touch panel 12 includes a sensor electrode SE, and the sensor electrode SE is connected to a sense pin SNS of the capacitance detection circuit 20. The capacitance detection circuit 20 detects an electrostatic capacitance Cs generated between the sensor electrode SE and a finger 2 of a user or a stylus.

The capacitance detection circuit 20 includes multiple switches SW81 to SW90, four reference capacitors Cr1 to Cr4, and an analog-to-digital converter (ADC) 22. The electrostatic capacitance Cs is converted to differential voltage signals Vs_p and Vs_n by the multiple switches SW81 to SW90 and the four reference capacitors Cr1 to Cr4, and then converted to a digital signal by the ADC 22.

PRIOR ART DOCUMENTS

Patent Documents

[Patent document 1] Japan Patent Publication No. 2015-132506
[Patent document 2] Japan Patent Publication No. 2014-45475

SUMMARY

Each of the reference capacitors Cr1 to Cr4 has a capacitance equivalent to the electrostatic capacitance Cs formed by the sensor electrode SE. In recent years, the capacitance of the electrostatic capacitance Cs increases along with the continuous trend of thinning the touch panel 12. Thus, when the reference capacitors Cr1 to Cr4 are integrated on a semiconductor chip, the area occupied thereof is increased, incurring to higher production costs.

The present disclosure is implemented in view of the above issues, and an exemplary object of an embodiment thereof is to provide a capacitance detection circuit for reducing a chip area.

A capacitance detection circuit according to an embodiment includes: a sense pin connected to a sensor electrode; a reference capacitor; a first driving unit configured to apply a high voltage or a low voltage to the sense pin; a second driving unit configured to apply the high voltage or the low voltage to a first terminal of the reference capacitor; a third driving unit configured to apply the high voltage or the low voltage to a second terminal of the reference capacitor; a first switch disposed between the sense pin and the first terminal of the reference capacitor; and a second switch disposed between an input of a post-stage circuit block and the first terminal of the reference capacitor.

A capacitance detection circuit according to an embodiment includes: a sense pin connected to a sensor electrode; a first reference capacitor; a second reference capacitor; a first driving unit configured to apply a high voltage or a low voltage to the sense pin; a second driving unit configured to apply the high voltage or the low voltage to a first terminal of the first reference capacitor; a third driving unit configured to apply the high voltage or the low voltage to a second terminal of the first reference capacitor; a fourth driving unit configured to apply the high voltage or the low voltage to a first terminal of the second reference capacitor; a fifth driving unit configured to apply the high voltage or the low voltage to a second terminal of the second reference capacitor; a first switch disposed between the sense pin and the first terminal of the first reference capacitor; a second switch disposed between a first input of a post-stage circuit block including differential inputs and the first terminal of the first reference capacitor; a third switch disposed between the sense pin and the first terminal of the second reference capacitor; and a fourth switch disposed between a second input of the post-stage circuit block and the first terminal of the second reference capacitor.

Moreover, any combination from the constituents above or any expression of the present disclosure as a conversion between methods and devices is also effective as a form of the present disclosure.

According to the present disclosure, the chip area can be reduced.

BRIEF DESCRIPTION OF THE DRAWINGS

FIG. 3A to FIG. 3F are equivalent circuit diagrams of a capacitance/voltage (C/V) conversion circuit in a first phase $\phi_1$, a second phase $\phi_2$, ... to a sixth phase $\phi_6$;

FIGS. 11A TO FIG. 11B are diagrams for illustrating a layout of a capacitance detection circuit;

DETAILED DESCRIPTION OF THE EMBODIMENTS

Figure 1:
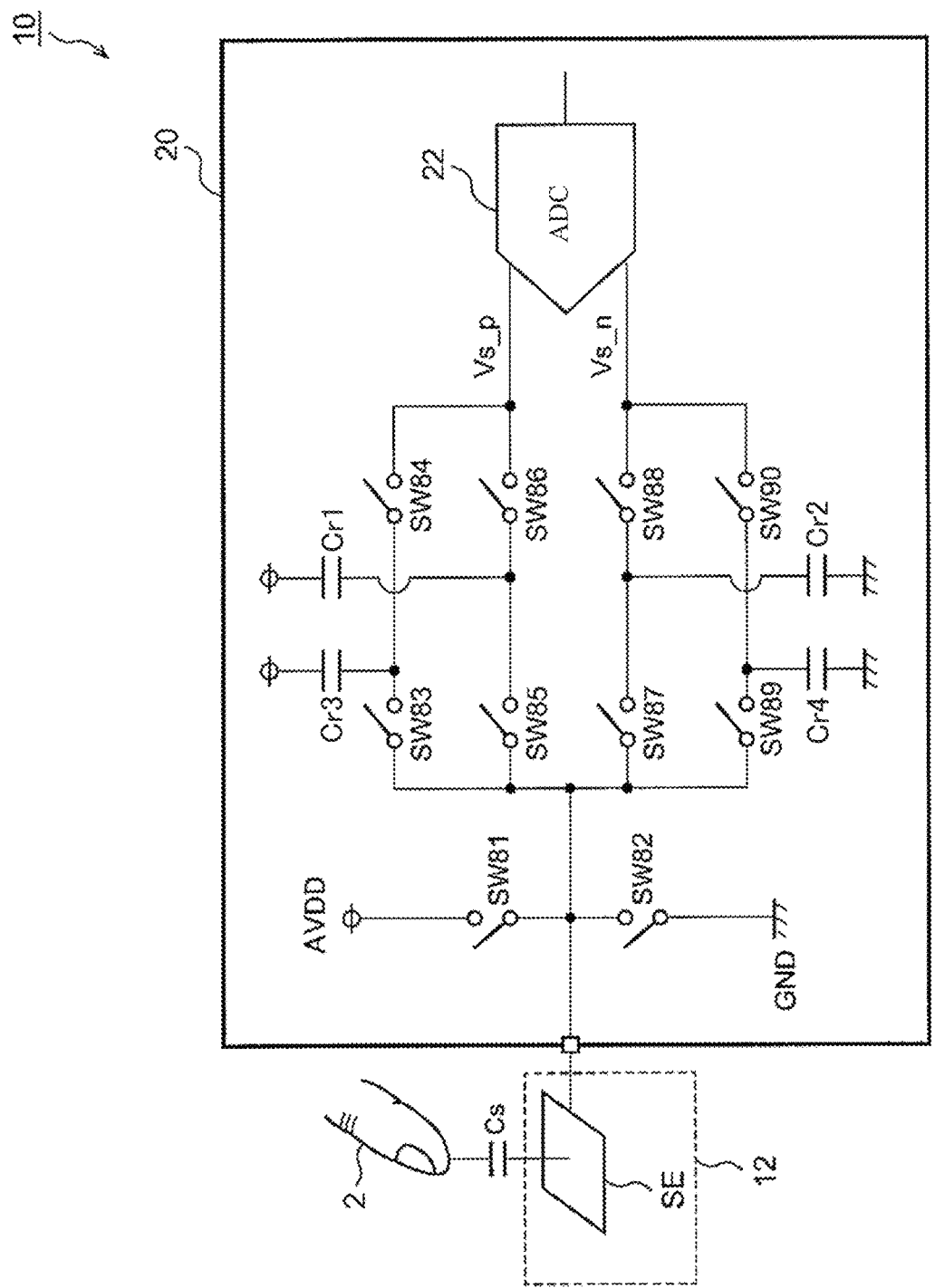
FIG. 1 shows a block diagram of a touch type input device of the self-capacitance type according to a comparative embodiment.

One or more aspects of the present invention are described with reference to the following description and the accompanying drawings, wherein like reference numerals are generally utilized to refer to like elements throughout, and wherein the various structures are not necessarily drawn to scale. These are indicative, however, of but a few of the various ways in which the principles of the invention may be employed. Other objects, advantages and novel features of the invention will become apparent from the following detailed description of the invention when considered in conjunction with the drawings. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are shown in block diagram or not shown in detail to avoid obscuring the invention. The present invention is not limited by the illustrated ordering of acts or events, as some acts may occur in different orders and/or concurrently with other acts or events. Further, not all illustrated acts or events are required to implement a methodology in accordance with the present invention.

In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. While a particular feature of the invention may have been disclosed with respect to only one of several aspects of the implementations, such feature may be combined with one or more other features of other implementations as may be desired and advantageous for any given or particular application.

An embodiment disclosed in the detailed description relates to a capacitance detection circuit for detecting a capacitance of a sensor electrode. The capacitance detection circuit includes: a sense pin connected to a sensor electrode; a reference capacitor; a first driving unit configured to apply a high voltage or a low voltage to the sense pin; a second driving unit configured to apply the high voltage or the low voltage to a first terminal of the reference capacitor; a third driving unit configured to apply the high voltage or the low voltage to a second terminal of the reference capacitor; a first switch disposed between the sense pin and the first terminal of the reference capacitor; and a second switch disposed between an input of a post-stage circuit block and the first terminal of the reference capacitor.

According to the configuration above, the number of the reference capacitor can be reduced to one, and the circuit area can be reduced.

In the capacitance detection circuit, in a first phase, the first driving unit applies the high voltage to the sense pin, the second driving unit applies the low voltage to the first terminal of the reference capacitor, and the third driving unit applies the high voltage to the second terminal of the reference capacitor; in a second phase, the first switch is closed, and the third driving unit applies the low voltage to the second terminal of the reference capacitor; and in a third phase, the second switch is closed, and the third driving unit applies the low voltage to the second terminal of the reference capacitor.

Furthermore, in the capacitance detection circuit, in a fourth phase, the first driving unit applies the low voltage to the sense pin, the second driving unit applies the high voltage to the first terminal of the reference capacitor, and the third driving unit applies the high voltage to the second terminal of the reference capacitor; in a fifth phase, the first switch is closed, and the third driving unit applies the high voltage to the second terminal of the reference capacitor; and in a sixth phase, the second switch is closed, the third driving unit applies the high voltage to the second terminal of the reference capacitor.

The post-stage circuit block can include a sigma-delta (Δs) modulator.

The post-stage circuit block can include an integrator, and an analog-to-digital converter (ADC) configured to convert an output of the integrator to a digital value.

The reference capacitor can be a variable capacitor, and includes a plurality of capacitive elements and multiple switches disposed between a first side of the plurality of capacitive elements and the first terminal.

The second driving unit can independently apply the high voltage and the low voltage to a second side of each of the plurality of capacitive elements.

The plurality of capacitive elements in the reference capacitor can be Metal-Insulator-Metal (MIM) capacitors, and at least one portion of the plurality of capacitive elements is disposed at a region overlapping with an integrated region of a transistor element. Accordingly, the chip area can be further reduced.

An embodiment disclosed in the detailed description further relates to a capacitance detection circuit. The capacitance detection circuit includes: a sense pin connected to a sensor electrode; a first reference capacitor; a second reference capacitor; a first driving unit configured to apply a high voltage or a low voltage to the sense pin; a second driving unit configured to apply the high voltage or the low voltage to a first terminal of the first reference capacitor; a third driving unit configured to apply the high voltage or the low voltage to a second terminal of the first reference capacitor; a fourth driving unit configured to apply the high voltage or the low voltage to a first terminal of the second reference capacitor; a fifth driving unit configured to apply the high voltage or the low voltage to a second terminal of the second reference capacitor; a first switch disposed between the sense pin and the first terminal of the first reference capacitor; a second switch disposed between a first input of a post-stage circuit block including differential inputs and the first terminal of the first reference capacitor; a third switch disposed between the sense pin and the first terminal of the second reference capacitor; and a fourth switch disposed between a second input of the post-stage circuit block and the first terminal of the second reference capacitor.

According to the configuration above, the number of the reference capacitor can be reduced to two, and the circuit area can be reduced.

The capacitance detection circuit can be integrated on a semiconductor integrated circuit. The so-called "integrated" includes a situation where all components of the circuit are formed on a semiconductor substrate, or including a situation where main components of the circuit are integrated, while having a portion of resistors or capacitors configured on the outside of the semiconductor substrate for adjusting a circuit constant. By integrating the circuit on one chip, the circuit area can be reduced, and characteristics of the circuit elements can be kept in uniform.

EMBODIMENTS

The present disclosure is described by way of appropriate embodiments with the accompanying drawings below. The same symbols and denotations are assigned to the same or equivalent constituents, components and processes in the drawings, and repeated description is appropriately omitted. Furthermore, the embodiments are merely illustrative and exemplary, and are not to be construed as limitations to the present disclosure. Further, not all features and combinations thereof stated in the embodiments are necessarily essentials of the present disclosure.

In the detailed description, as used herein, the term "connected" as used to describe the situation of "a state in which component A is connected to component B" is defined to include a situation where component A is physically and directly connected to component B, and includes a situation where component A is indirectly connected to component B via other components without producing substantive influences on the electrical connection state of said components, or without damaging functions or effects achieved by the combinations of said components.

Similarly, as used herein, the term "disposed" as used to describe the situation of "a state in which component C is disposed between component A and component B" is defined to include, a situation where component A and component C, or component B and component C are directly connected, and a situation of indirect connection via other components without producing substantive influences on the electrical connection state of said components, or without damaging functions or effects achieved by the combinations of said components.

Figure 2:
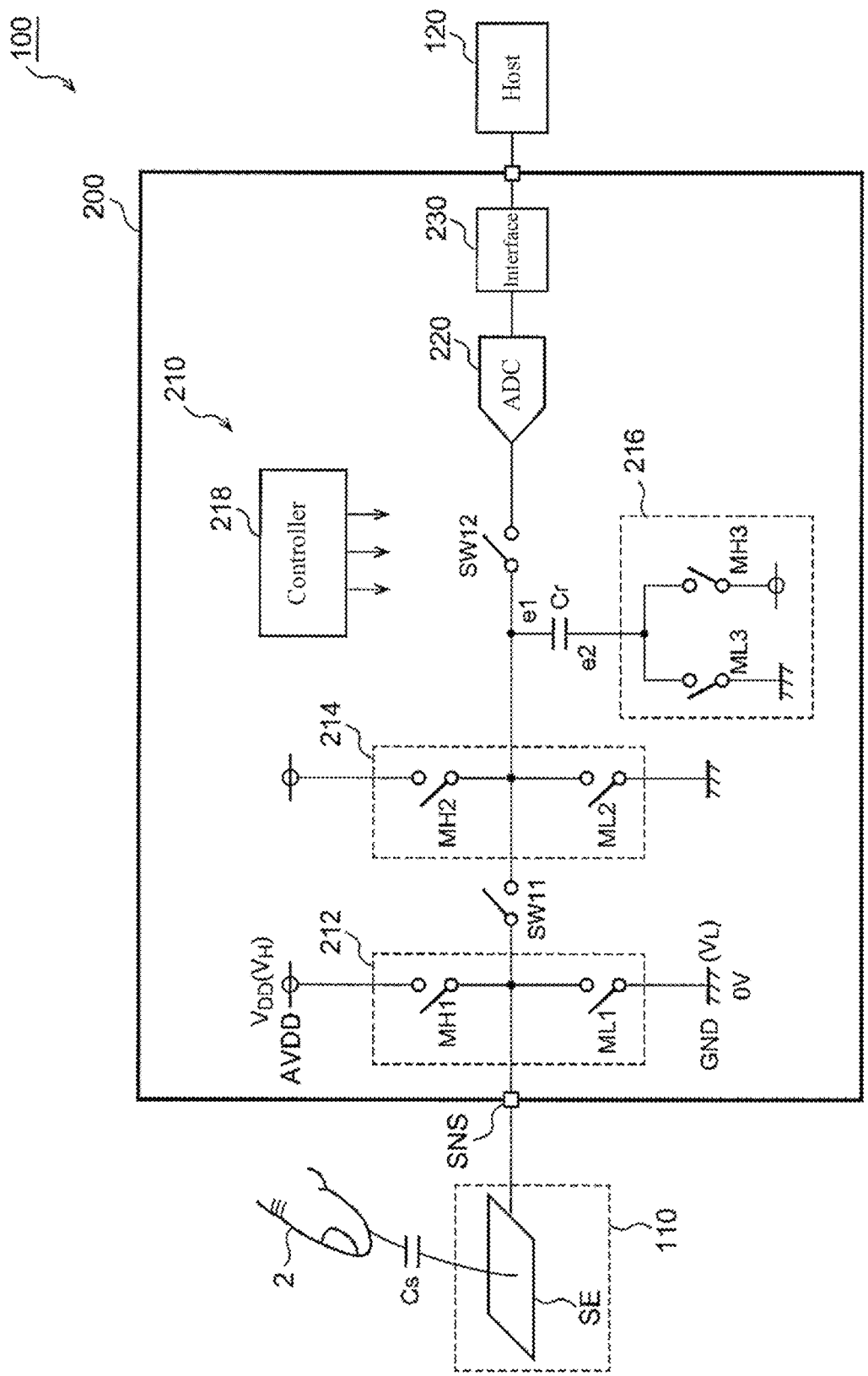
FIG. 2 is a block diagram of a touch type input device including a capacitance detection circuit according to a first embodiment of the present disclosure.

FIG. 2 shows a block diagram of a touch type input device 100 including a capacitance detection circuit 200 according to a first embodiment. The touch type input device 100 includes a panel 110 and the capacitance detection circuit 200. The touch type input device 100 is a user interface for detecting a touch operation performed by a finger 2 (or a stylus) of a user.

The panel 110 is a touch panel or a switch panel, and includes one or more sensor electrodes SE. In this embodiment, only the part corresponding to one sensor electrode SE is depicted.

A host processor 120 integrally controls machines, apparatuses and systems disposed with the touch type input device 100. The capacitance detection circuit 200 detects an electrostatic capacitance of each sensor electrode SE, and transmits them to the host processor 120. Furthermore, the capacitance detection circuit 200 can compare a detected electrostatic capacitance Cs with a threshold to value detect the presence or absence of a touch and transmit an indication of the presence or absence of touch operation to the host processor 120.

The capacitance detection circuit 200 includes a sense pin SNS, a capacitance/voltage (C/V) conversion circuit 210, an analog-to-digital converter (ADC) 220 and an interface circuit 230.

The sensor electrode SE is connected to the sense pin SNS. The C/V conversion circuit 210 converts the electrostatic capacitance Cs generated by the sensor electrode SE to a voltage signal Vs. The ADC 220 is coupled to the output of the analog circuit 210 and converts the voltage signal Vs to a digital signal Ds. The interface circuit 230 is coupled to the ADC 220 and transmits the digital signal Ds to the host processor 120.

The C/V conversion circuit 210 is a front end circuit that converts the electrostatic capacitance Cs to a voltage signal, and includes a first driving unit 212, a second driving unit 214, a third driving unit 216, a first switch SW11, a second switch SW12, a reference capacitor Cr and a controller 218.

The first driving unit 212 applies a high voltage $V_H$ or a low voltage $V_L$ to the sense pin SNS. For example, the high voltage $V_H$ is a power voltage $V_{DD}$ of a power line AVDD, and the low voltage $V_L$ is a ground voltage $V_{GND}$ (=0 V) of a ground line GND.

The second driving unit 214 applies the high voltage $V_H$ or the low voltage $V_L$ to a first terminal e1 of the reference capacitor Cr.

The third driving unit 216 applies the high voltage $V_H$ or the low voltage $V_L$ to a second terminal e2 of the reference capacitor Cr.

Each of the first driving unit 212, the second driving unit 214 and the third driving unit 216 includes a high-side switch MH and a low-side switch ML.

The first switch SW11 is disposed between the sense pin SNS and the first terminal e1 of the reference capacitor Cr. The second switch SW12 is disposed between an input of the post-stage ADC 220 and the first terminal e1 of the reference capacitor Cr.

The controller 218 is configured to control the first driving unit 212, the second driving unit 214, the third driving unit 216, the first switch SW11 and the second switch SW12. In this embodiment, the controller 218 switches the state of the C/V conversion circuit 210 between a first phase $\phi_1$, a second phase $\phi_2$, ... and a sixth phase $\phi_6$. FIGS. 3(a) to 3(f) show equivalent circuit diagrams of the C/V conversion circuit 210 in the first phase $\phi_1$, the second phase $\phi_2$, ... to the sixth phase $\phi_6$. The first phase $\phi_1$, the second phase $\phi_2$ and the third phase $\phi_3$ are the unit for one round of sensing, and the fourth phase $\phi_4$, the fifth phase $\phi_5$, ... to the sixth phase $\phi_6$ are the unit for one round of sensing.

As shown in FIG. 3A, in the first phase $\phi_1$, the first driving unit 212 applies the high voltage $V_H$ to the sense pin SNS, the second driving unit 214 applies the low voltage $V_L$ to the first terminal e1 of the reference capacitor Cr, and the third driving unit 216 applies the high voltage $V_H$ to the second terminal e2 of the reference capacitor Cr. At this point in time, a charge amount Qr of the reference capacitor Cr becomes 0, and a charge amount Qs of the electrostatic capacitance Cs becomes $V_H \times Cs$.

As shown in FIG. 3B, in the second phase $\phi_2$, the first switch SW11 is closed, and the third driving unit 216 applies the low voltage $V_L$ to the second terminal e2 of the reference capacitor Cr. As used in this specification, when a switch is described as "closed," it means that current may flow across the switch; a switch may include a transistor switch, mechanical switch, or other switch. In this state, transmission between the electrostatic capacitance Cs and the reference capacitor Cr is formed, thereby smoothing the charge amounts Qs and Qr.

$$Cs \times V_H = (Cs + Cr) \times Vs$$

At this point in time, the internal voltage Vs is represented by equation (1):

$$Vs = Cs/(Cs+Cr) \times V_H \quad (1)$$

As shown in FIG. 3C, in the third phase $\phi_3$, the second switch SW12 is closed, and the third driving unit 216 applies the low voltage $V_L$ to the second terminal e2 of the reference capacitor Cr. Thereby, the sensing voltage Vs is supplied to the ADC 220 in the post-stage.

As shown in FIG. 3D, in the fourth phase $\phi_4$, the first driving unit 212 applies the low voltage $V_L$ to the sense pin SNS, the second driving unit 214 applies the high voltage $V_H$ to the first terminal e1 of the reference capacitor Cr, and the third driving unit 216 applies the high voltage $V_H$ to the second terminal e2 of the reference capacitor Cr. At this point in time, the charge amount Qr of the reference capacitor Cr becomes 0, and the charge amount Qs of the electrostatic capacitance Cs becomes 0.

As shown in FIG. 3E, in the fifth phase $\phi_5$, the first switch SW11 is closed, and the third driving unit 216 applies the high voltage $V_H$ to the second terminal e2 of the reference capacitor Cr. In this state, the internal voltage Vs is represented by equation (2):

$$Vs = Cr/(Cs+Cr) \times V_H = V_H - Cs/(Cs+Cr) \times V_H \quad (2)$$

As shown in FIG. 3F, in the sixth phase $\phi_6$, the second switch SW12 is closed, and the third driving unit 216 applies the high voltage $V_H$ to the second terminal e2 of the reference capacitor Cr. Thereby, the sensing voltage Vs is supplied to the ADC 220 in post-stage.

Figure 4:
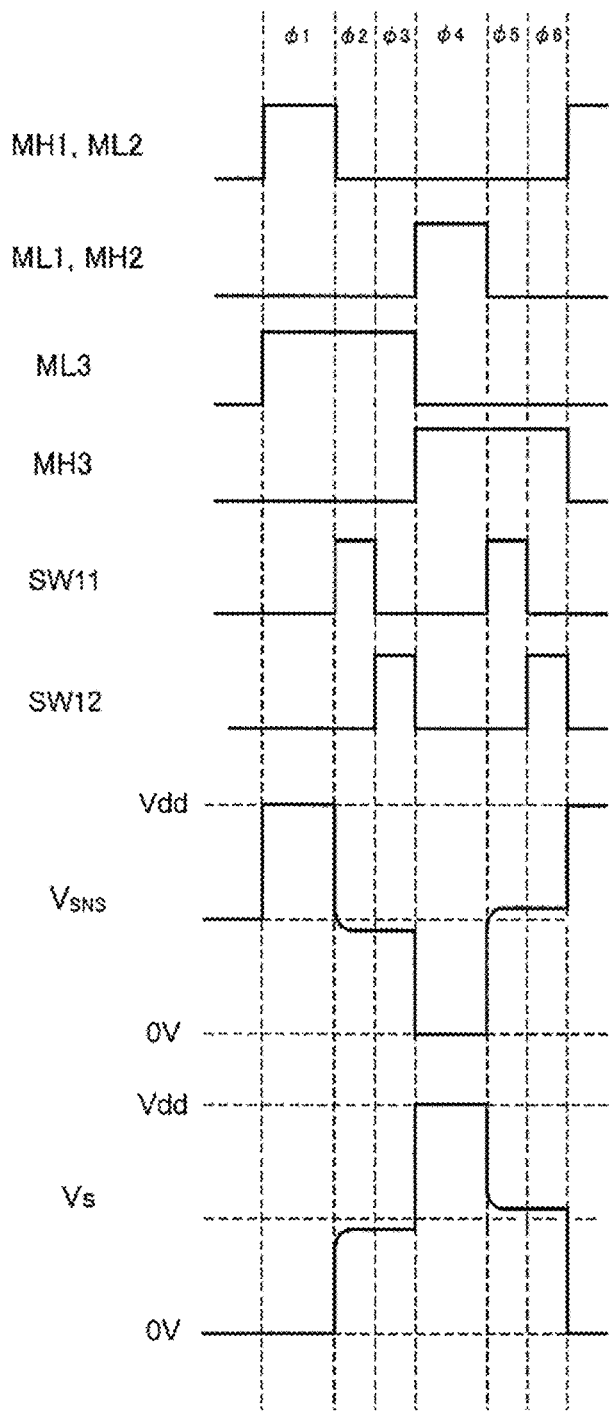
FIG. 4 is a waveform diagram illustrating the operation of the C/V conversion circuit in FIG. 2.

An example of a configuration of the touch type input device 100 is as described above, and the operation thereof is subsequently described. FIG. 4 shows a waveform diagram of the operation of the C/V conversion circuit 210 in FIG. 2. In the first phase $\phi_1$, the switch MH1 is closed, and the voltage $V_{SNS}$ of the sense pin SNS becomes the high voltage $V_H = V_{DD}$. Furthermore, the switches ML2 and ML3 are closed, and the internal voltage Vs becomes the low voltage $V_L = 0$ V. In the following second phase $\phi_2$, the first switch SW11 is closed, electric charges are transmitted between the electrostatic capacitance Cs and the reference capacitor Cr, and the internal voltage Vs is stable at the voltage level represented by equation (1). Then, in the third phase $\phi_3$, the second switch SW12 is closed, and the internal voltage Vs is supplied to the post stage.

In the fourth phase $\phi_4$, the switch ML1 is closed, and the voltage $V_{SNS}$ of the sense pin SNS becomes the low voltage $V_L = 0$ V. Furthermore, the switches MH2 and MH3 are closed, and the internal voltage Vs becomes the high voltage $V_H = V_{DD}$. In the following fifth phase $\phi_5$, the first switch SW11 is closed, and electric charges are transmitted between the electrostatic capacitance Cs and the reference capacitor Cr, and the internal voltage Vs is stable at the voltage level represented by equation (2). Then, in the sixth phase $\phi_6$, the second switch SW12 is closed, and the internal voltage Vs is supplied to the post stage.

The operation of the capacitance detection circuit 200 is as described above. The capacitance detection circuit 200 is capable of reducing the number of the reference capacitor Cr to one, hence reducing the circuit area.

Figure 5:
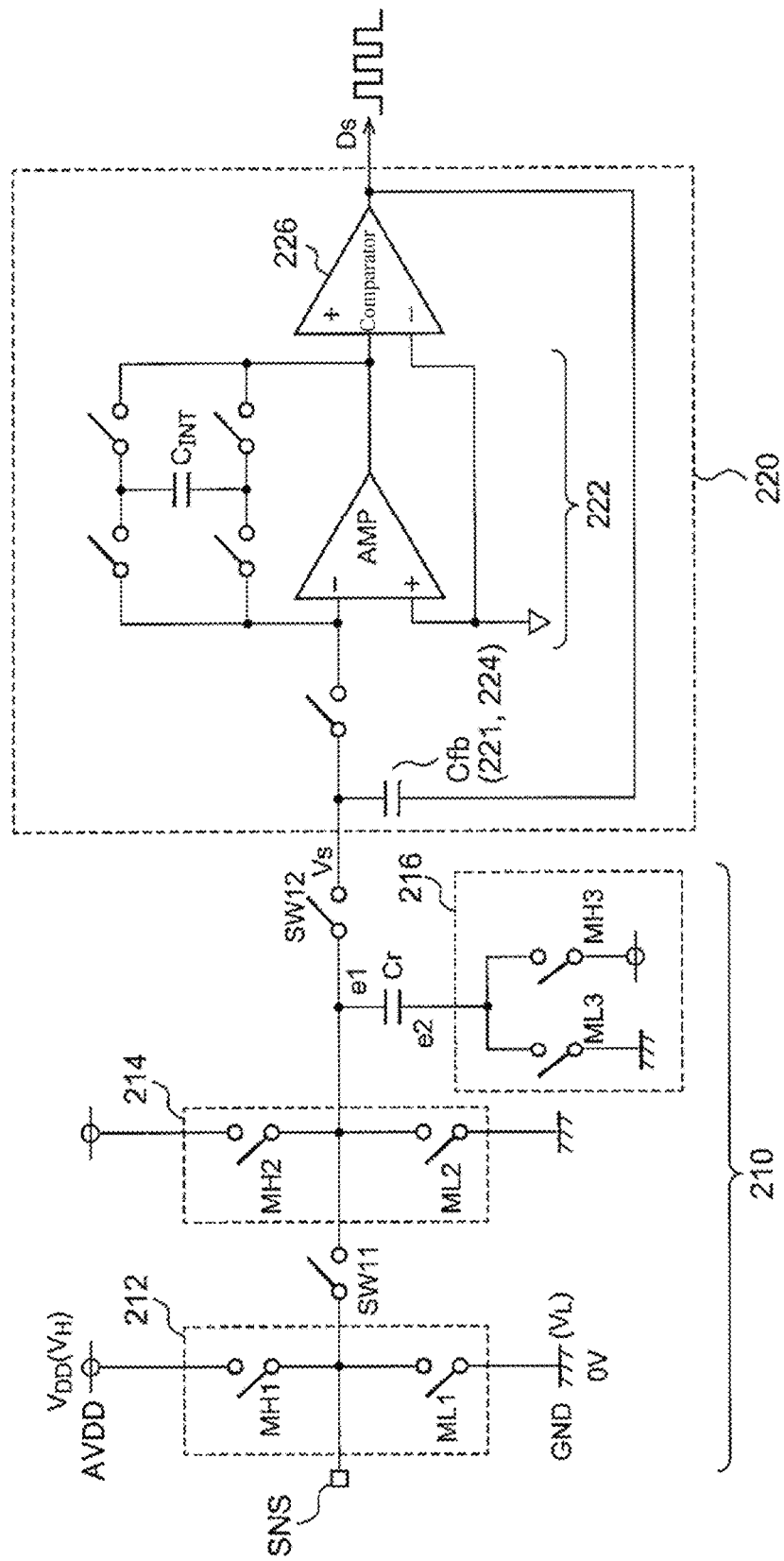
FIG. 5 is a diagram showing an example of a specific configuration example of a capacitance detection circuit.

FIG. 5 illustrates an example of a diagram of a specific configuration of the capacitance detection circuit 200. The ADC 220 is a delta-sigma ($\Delta\Sigma$) modulator, and the digital signal Ds is a bitstream obtained by oversampling.

The $\Delta\Sigma$ modulator usually includes a subtractor 221, an integrator 222, a comparator 223 and a digital-to-analog converter (DAC) 224. In this configuration, a capacitor Cfb serves the functions of the subtractor 221 and the DAC 224. By using the capacitor Cfb, a high voltage or a low voltage corresponding to the bitstream Ds is feed backed to the input of the ADC 220, and a signal component equivalent to a difference to the sensing voltage Vs from the C/V conversion circuit 210 is inputted to the integrator 222. The integrator 222 accumulates the difference. The comparator 226 compares an output of the integrator 222 with the reference voltage, and converts the same to a bitstream. Four switches are provided on two terminals of a capacitor $C_{INT}$ of the integrator 222, and the polarity of the capacitor $C_{INT}$ is inverted during the periods of processing the voltage Vs obtained in the third phase $\phi_3$ and the voltage Vs obtained in the sixth phase $\phi_6$.

Furthermore, the configuration of the ADC 220 is not limited to that in FIG. 5, and ADCs in various forms and approaches can be utilized.

Second Embodiment

Figure 6:
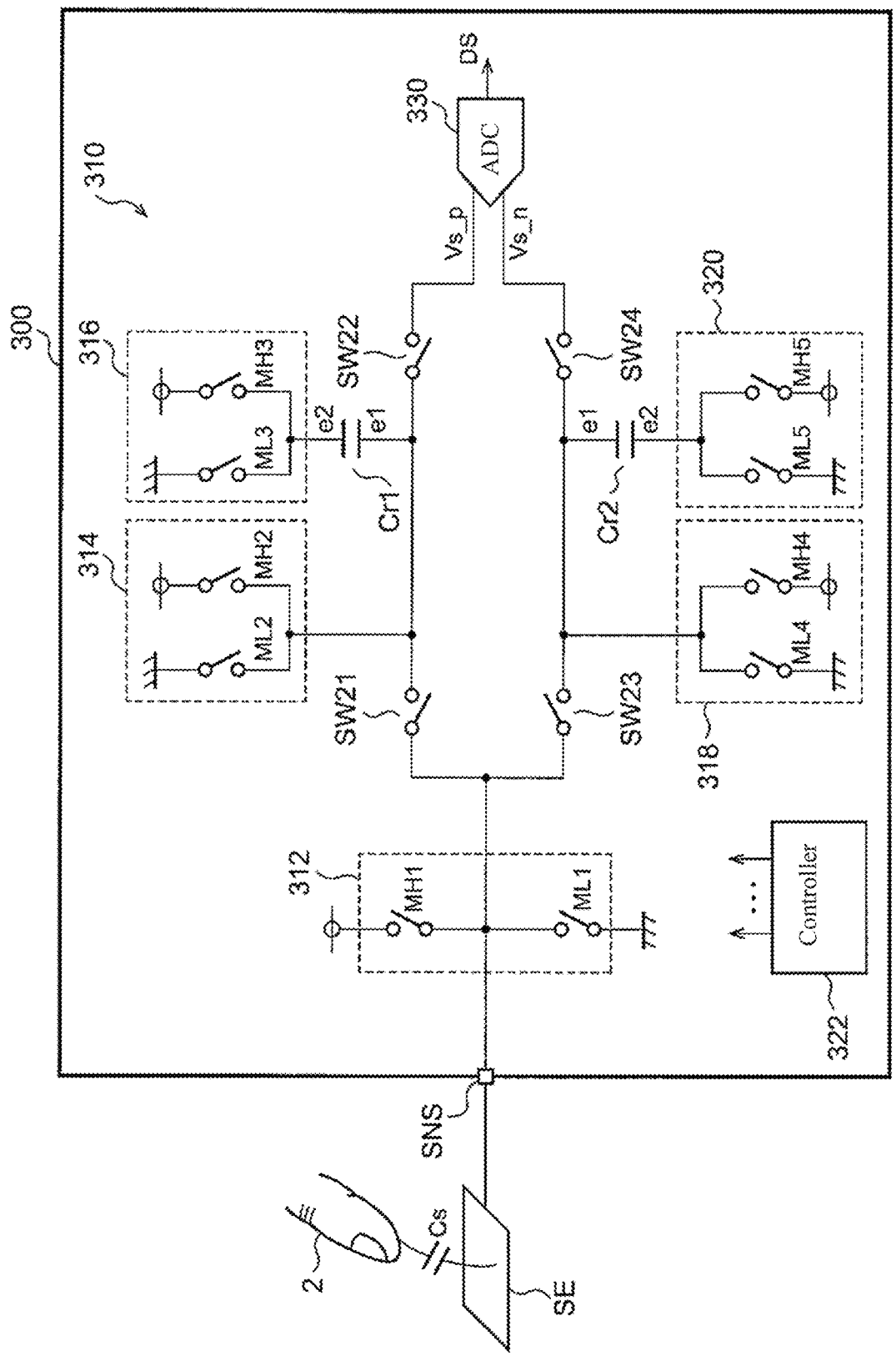
FIG. 6 is a circuit diagram illustrating a capacitance detection circuit according to a second embodiment.

FIG. 6 shows a circuit diagram of a capacitance detection circuit 300 according to a second embodiment. The capacitance detection circuit 300 includes a C/V conversion circuit 310 and an ADC 330. The ADC 330 has differential inputs.

The sensor electrode SE is connected to the sense pin SNS. The C/V conversion circuit 310 includes a first driving unit 312, a second driving unit 314, a third driving unit 316, a fourth driving unit 318, a fifth driving unit 320, a controller 322, a first switch SW21, a second switch SW22, a third switch SW23, and a fourth switch SW24.

The first driving unit 312 applies the high voltage $V_H$ or the low voltage $V_L$ to the sense pin SNS. The second driving unit 314 applies the high voltage $V_H$ or the low voltage $V_L$ to a first terminal e1 of a first reference capacitor Cr1. The third driving unit 316 applies the high voltage $V_H$ or the low voltage $V_L$ to a second terminal e2 of the first reference capacitor Cr1. The fourth driving unit 318 applies the high voltage $V_H$ or the low voltage $V_L$ to a first terminal e1 of a second reference capacitor Cr2. The fifth driving unit 320 applies the high voltage $V_H$ or the low voltage $V_L$ to a second terminal e2 of the second reference capacitor Cr2.

Each of the first driving unit 312, the second driving unit 314 . . . and the fifth driving unit 320 includes a high-side switch MH and a low-side switch ML. The first switch SW21 is disposed between the sense pin SNS and the first terminal e1 of the first reference capacitor Cr1. The second switch SW22 is disposed between a first input of the differential inputs of the ADC 220 and the first terminal e1 of the first reference capacitor Cr1.

The third switch SW23 is disposed between the sense pin SNS and the first terminal e1 of the second reference capacitor Cr2. The fourth switch SW24 is disposed between the second input of the ADC 220 and the first terminal e1 of the second reference capacitor Cr2.

The controller 322 controls the first driving unit 312, the second driving unit 314 . . . and the fifth driving unit 320, and the first switch SW21, the second switch SW22 . . . and the fourth switch SW24.

FIGS. 7(a) to 7(f) are equivalent circuit diagrams of the C/V conversion circuit 310 in the first phase $\phi_1$ to the fifth phase $\phi_5$. The first phase $\phi_1$ and the second phase $\phi_2$ in FIGS. 7(a) and 7(b) correspond to the first phase $\phi_1$ and the second phase $\phi_2$ in FIGS. 3(a) and 3(b), respectively. In the second phase $\phi_2$, an internal voltage Vs1 of equation (1a) is generated:

$$Vs1 = Cs/(Cs+Cr1) \times V_H \qquad (1a)$$

Figure 7A:
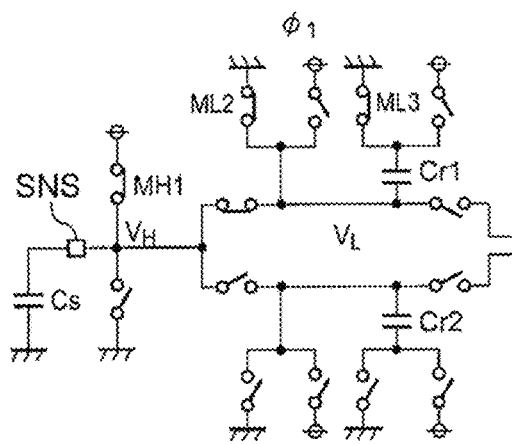
FIG. 7A to FIG. 7E are equivalent circuit diagrams illustrating a C/V conversion circuit in a first phase $\phi_1$, a second phase $\phi_2$, ... to a fifth phase $\phi_5$.
Figure 7B:
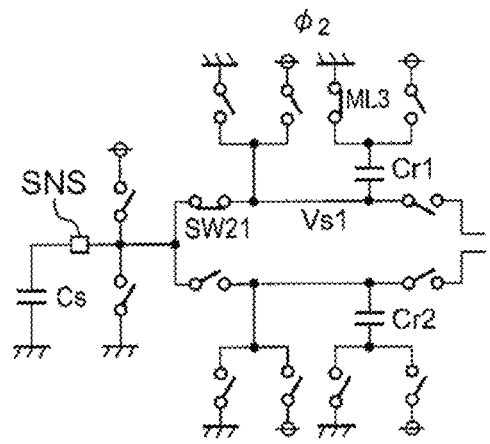
Figure 7C:
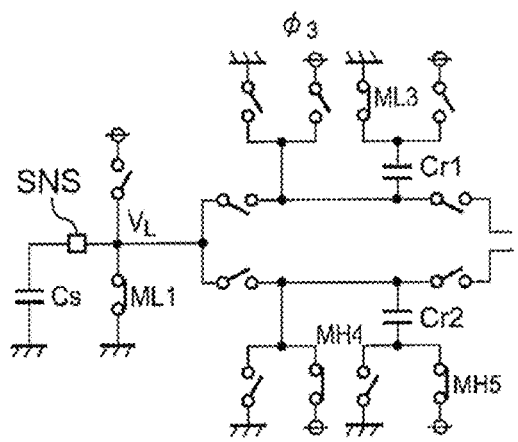
Figure 7D:
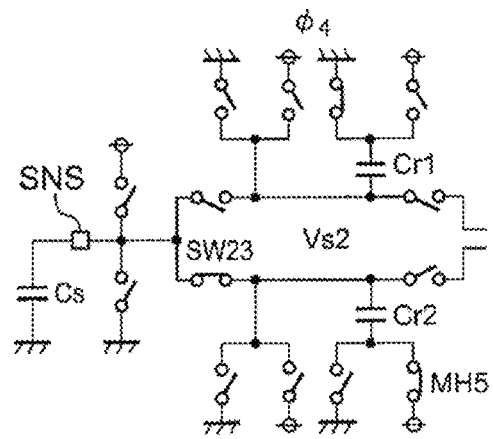

The third phase $\phi_3$ and the fourth phase $\phi_4$ in FIGS. 7(c) and 7(d) correspond to the fourth phase $\phi_4$ and the fifth phase $\phi_5$ in FIGS. 3(d) and 3(e), respectively. In the fourth phase $\phi_4$, an internal voltage Vs2 of equation (2a) is generated:

$$Vs2 = V_H - Cs/(Cs+Cr2) \times V_H \qquad (2a)$$

Figure 7E:
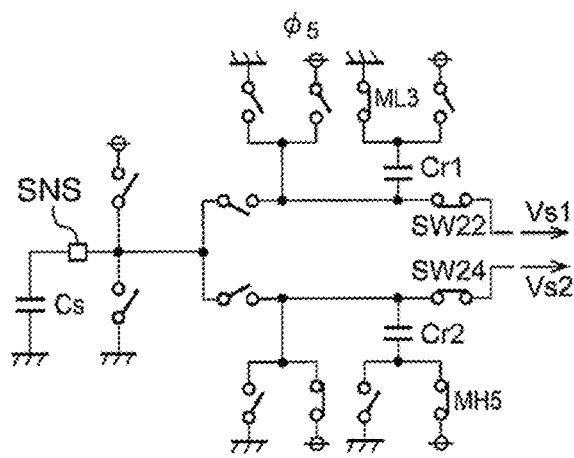

In the fifth phase $\phi_5$ of FIG. 7E, the second switch SW22 and the fourth switch SW24 are closed, and the differential signals Vs1 and Vs2 are supplied to the ADC 330 in post-stage.

Figure 8A:
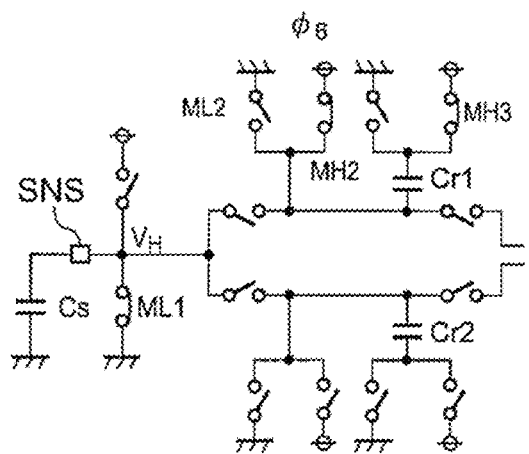
FIGS. 8A-FIG. 8E are equivalent circuit diagrams illustrating a C/V conversion circuit in a sixth phase $\phi_6$ to a tenth phase $\phi_{10}$.
Figure 8B:
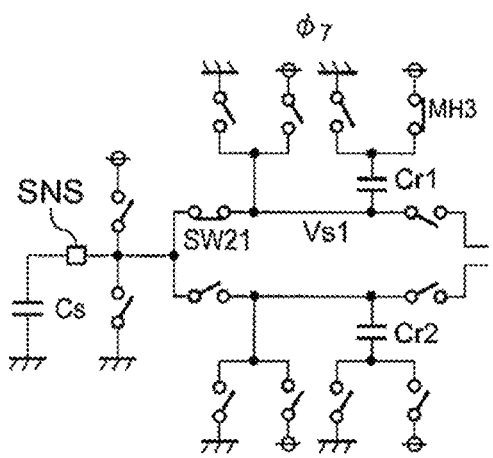

FIGS. 8(a) to 8(f) are equivalent circuit diagrams of the C/V conversion circuit 310 in a sixth phase $\phi_6$, a seventh phase $\phi_7$ . . . to a tenth phase $\phi_{10}$. FIGS. 8(a) and 8(b) depict processes performed after polarity inversion in the processes of FIGS. 7(a) and 7(b), respectively, and the internal voltage Vs1 of equation (1b) is generated:

$$Vs1 = V_H - Cs/(Cs+Cr1) \times V_H \qquad (1b)$$

Figure 8C:
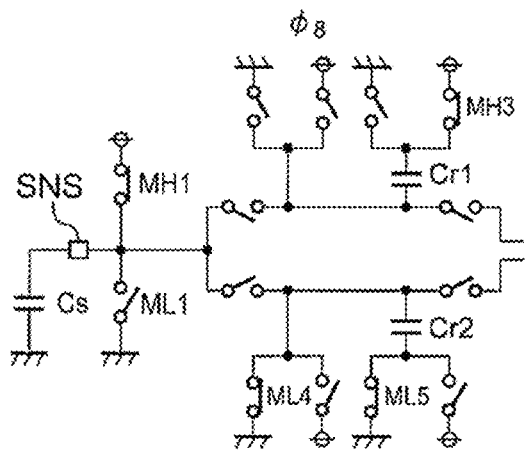
Figure 8D:
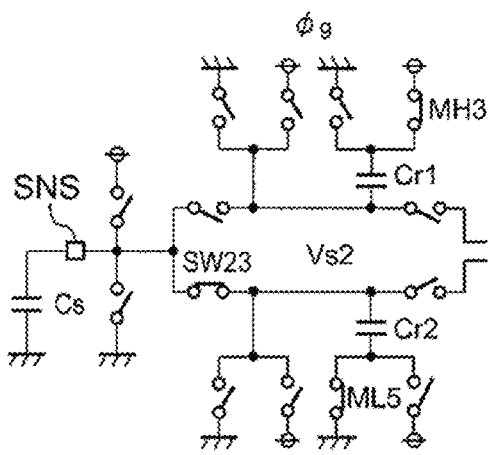

FIGS. 8(c) and 8(d) depict processes performed after polarity inversion in the processes of FIGS. 7(c) and 7(d), respectively, and an internal voltage Vs2 of equation (2b) is generated:

$$Vs2 = Cs/(Cs+Cr2) \times V_H \qquad (2b)$$

Figure 8E:
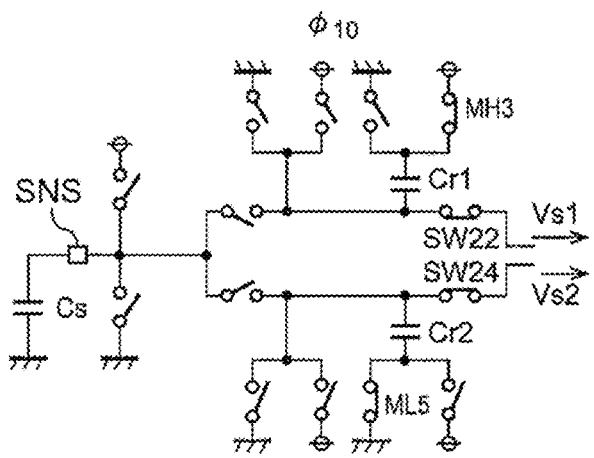

In the tenth phase $\phi_{10}$ in FIG. 8E, the second switch SW22 and the fourth switch SW24 are closed, and the differential signals Vs1 and Vs2 are supplied to the ADC 330 in post-stage.

In addition, it should be understood that a person skilled in the art can switch the orders of the phases in FIGS. 7A-FIG. 7E and FIG. 8A-FIG. 8E.

The operation of the capacitance detection circuit 300 is described as above. The capacitance detection circuit 300 is capable of reducing the number of the reference capacitor from four to two, hence reducing the circuit area.

An example of a specific configuration of the reference capacitor Cr is subsequently discussed. The C/V conversion circuit 210 of the first embodiment is taken as an example; however, the same description applies to the C/V conversion circuit 310 of the second embodiment.

Figure 9:
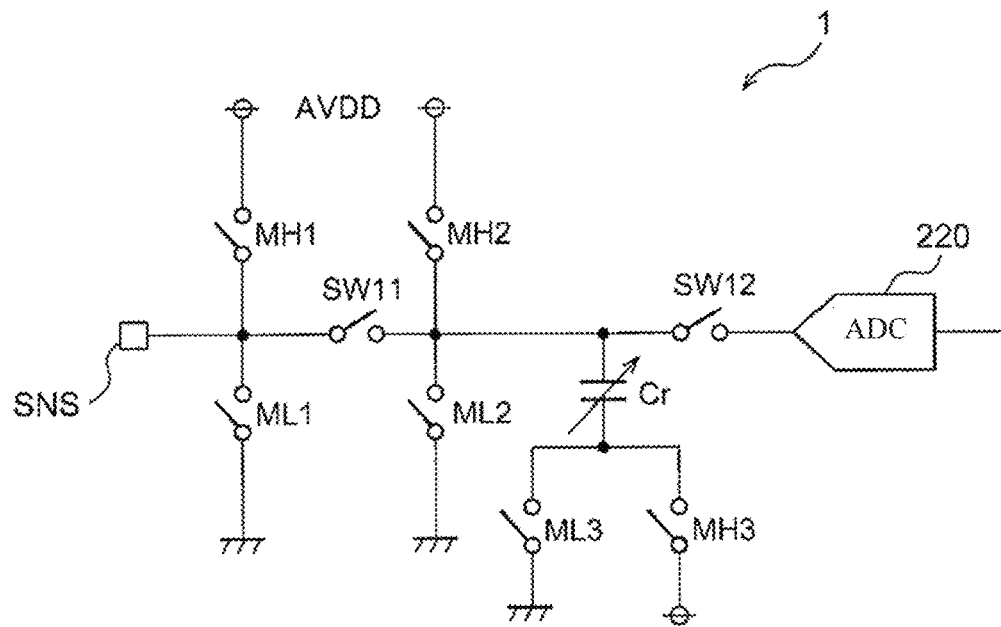
FIG. 9 is a circuit diagram illustrating a C/V conversion circuit.

FIG. 9 shows a circuit diagram of the C/V conversion circuit 210. The capacitance of the reference capacitor Cr is preferably equivalent to the electrostatic capacitance Cs, which is the detection target. For the capacitance detection circuit 200, versatility of application in combination with panels 110 having various sizes or thicknesses is required. Therefore, it is advisable that the reference capacitor Cr can include a variable capacitor. Moreover, the capacitance value of the reference capacitor Cr can be adjusted with respect to each product so as to become substantially equivalent to that of the electrostatic capacitance Cs.

Figure 10:
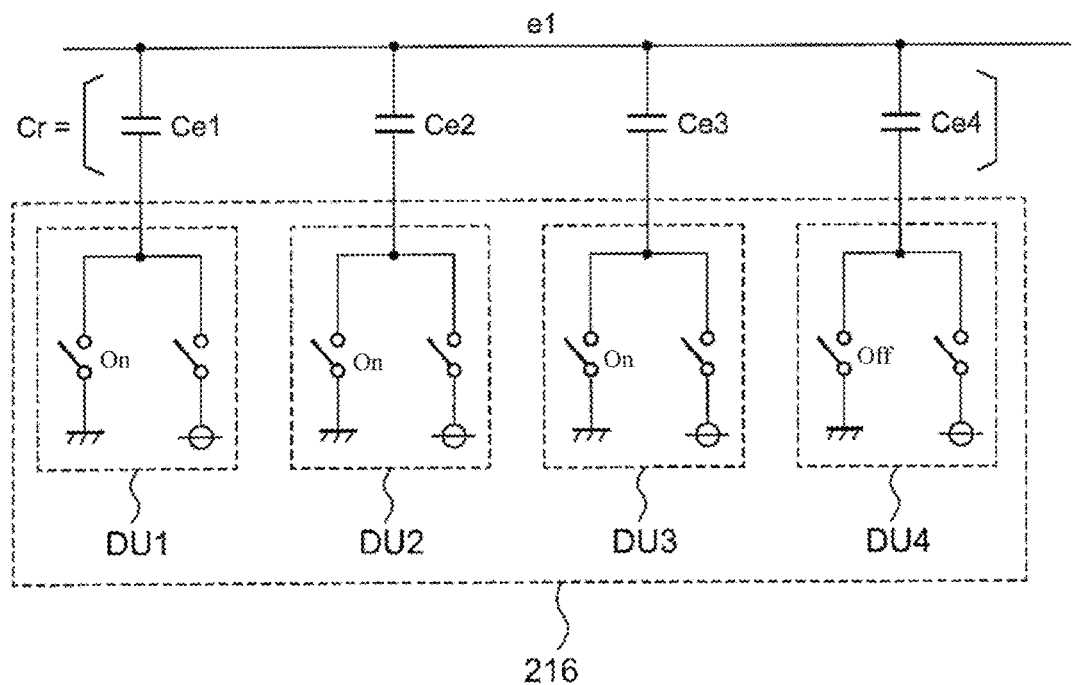
FIG. 10 is a circuit diagram illustrating a reference capacitor Cr and a third driving unit according to the first embodiment.

FIG. 10 shows a circuit diagram of the reference capacitor Cr and the third driving unit 216 of the first embodiment. The reference capacitor Cr includes multiple (four in this example) capacitive elements Ce1 to Ce4. The multiple capacitive elements Ce1 to Ce4 are commonly connected on the same side of the first terminal e1.

The third driving unit 216 includes individual driving parts DU1, DU2, DU3 and DU4 respectively corresponding to the multiple capacitive elements Ce1, Ce2, Ce3, and Ce4. By applying the case of having some of the driving parts DU1, DU2, DU3, and/or DU4 being in use while some remaining are not in use, the capacitance of the reference capacitor Cr can be switched. In the driving part DU that is not used, both of the high-side switch and the low-side switch are set as off.

FIG. 11A and FIG. 11B show diagrams of a layout of the capacitance detection circuit 200. The reference capacitor Cr is formed by a metal-insulator-metal (MIM) capacitor. In the layout of FIG. 11A, the reference capacitor Cr is formed in a passive region 402 different from the active region 400 formed with transistors.

In FIG. 11B, a portion or all of the reference capacitor Cr is configured to be overlapping with the active area 400 formed with transistors. With the configuration of FIG. 10, the following issues can be caused if the layout of FIG. 11B is used. When there is/are capacitive element Ce not in use, high impedance may occur at the side of the second terminal e2. Thus, the capacitive element Ce acts as a parasitic capacitance and is coupled to circuits in the active area. The coupling leads to problems such as increased noise and degraded precision for the electrostatic capacitance detection.

Figure 12A:
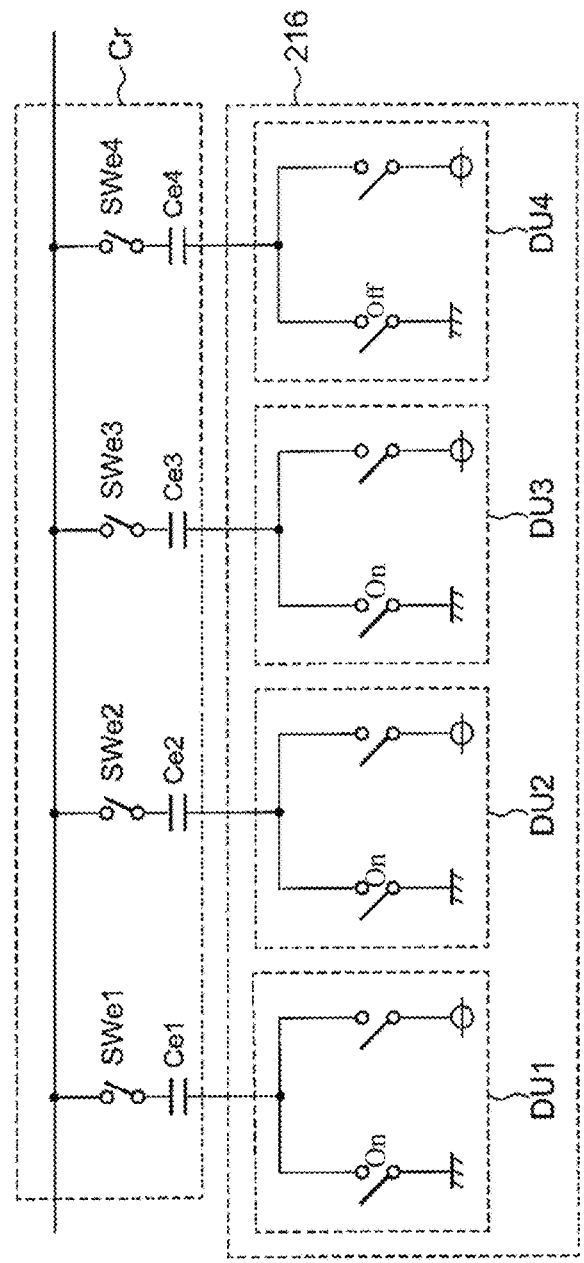
FIG. 12A is a circuit diagram illustrating a reference capacitor and a third driving unit according to the second embodiment of the present disclosure.

FIG. 12A shows a circuit diagram of the reference capacitor Cr and the third driving unit 216 of the second embodiment. The reference capacitor Cr includes multiple capacitive elements Ce1, Ce2, Ce3, and Ce4, and switches SWe1, SWe2, SWe3 and SWe4 inserted to the side of the first terminals e1 of the multiple capacitive elements Ce1, Ce2, Ce3, and Ce4. The configuration of the third driving unit 216 is the same as that in FIG. 10.

By adding the switches SWe1, SWe2, SWe3 SWe4, coupling between the capacitive element Ce that is not in use and circuits in the active area can be disconnected by the switch SWe. The capacitive element Ce that is not in use can be fixed at the high voltage or the low voltage at the side of the second terminal e2 by the driving part DU in advance. As a result, as shown in FIG. 11B, with an overlapping configuration of the MIM capacitor and the active area, surrounding environmental noise can be reduced, and degradation of detection precision can be alleviated. Thereby, the chip area can be reduced.

Figure 12B:
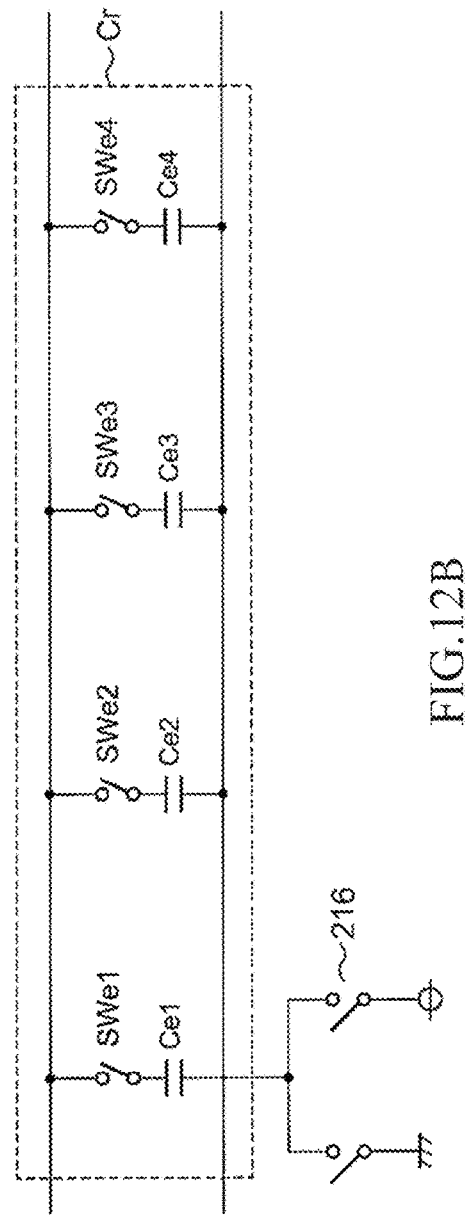
FIG. 12B is a circuit diagram illustrating a reference capacitor and a third driving unit according to a third embodiment of the present disclosure.

FIG. 12B shows a circuit diagram of the reference capacitor Cr and the third driving unit 216 of a third embodiment. The reference capacitor Cr includes multiple capacitive elements Ce1, Ce2, Ce3, and Ce4, and switches SWe1, SWe2, SWe3 and SWe4 inserted to the side of the first terminal e1 of the multiple capacitive elements Ce1, Ce2, Ce3, and Ce4. The third driving unit 216 is not divided into individual components corresponding to the individual capacitive elements Ce1, Ce2, Ce3, and Ce4, but is configured as one component to collectively connect thereto.

Figure 13:
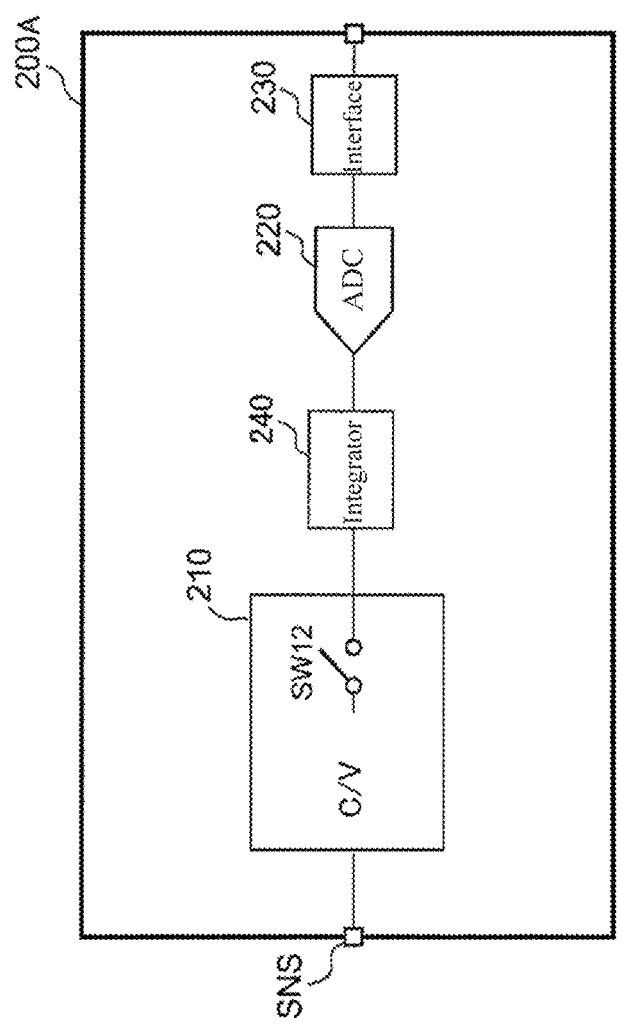
FIG. 13 is a circuit diagram illustrating a capacitance detection circuit according an alternative embodiment.

In the embodiments, a situation where a post-stage circuit block of the C/V conversion circuit 210 being an ADC is given as an example; however, the present disclosure is not limited thereto. FIG. 13 shows a circuit diagram of a capacitance detection circuit 200A of an alternative embodiment. In this alternative embodiment, the post-stage circuit block of the C/V conversion circuit 210 includes an integrator 240 and an ADC 220. An output signal of the C/V conversion circuit 210 is accumulated by the integrator 240 and hence amplified, and then converted to a digital value by the ADC 220.

What is claimed is:

1. A capacitance detection circuit for detecting a capacitance of a sensor electrode, comprising:
    a sense pin, connected to the sensor electrode;
    a reference capacitor;
    a first driving unit, configured to apply a high voltage or a low voltage to the sense pin;
    a second driving unit, configured to apply the high voltage or the low voltage to a first terminal of the reference capacitor;
    a third driving unit, configured to apply the high voltage or the low voltage to a second terminal of the reference capacitor;
    a first switch, disposed between the sense pin and the first terminal of the reference capacitor; and
    a second switch, disposed between an input of a post-stage circuit block and the first terminal of the reference capacitor,
    wherein the first switch is closed, and the third driving unit applies the low voltage to the second terminal of the reference capacitor when the capacitance detection circuit is in a first phase,
    the first driving unit applies the high voltage to the sense pin, the second driving unit applies the low voltage to the first terminal of the reference capacitor, and the third driving unit applies the low voltage to the second terminal of the reference capacitor when the capacitance detection circuit is in a second phase;
    the first switch is closed, and the third driving unit applies the low voltage to the second terminal of the reference capacitor when the capacitance detection circuit is in a third phase; and
    the second switch is closed, and the third driving unit applies the low voltage to the second terminal of the reference capacitor when the capacitance detection circuit is in a fourth phase,
    the first driving unit applies the low voltage to the sense pin, the second driving unit applies the high voltage to the first terminal of the reference capacitor, and the third driving unit applies the low voltage to the second terminal of the reference capacitor when the capacitance detection circuit is in a fifth phase; and
    the second switch is closed, and the third driving unit applies the low voltage to the second terminal of the reference capacitor when the capacitance detection circuit is in a sixth phase.

2. The capacitance detection circuit of claim 1, wherein the post-stage circuit block comprises a delta-sigma ($\Delta\Sigma$) modulator.

3. The capacitance detection circuit of claim 1, wherein the post-stage circuit block comprises an integrator, and an analog-to-digital converter (ADC) configured to convert an output of the integrator into a digital value.

4. The capacitance detection circuit of claim 1, wherein the reference capacitor is a variable capacitor, and the reference capacitor comprises:
    a plurality of capacitive elements; and
    a plurality of switches, disposed between a first side of the plurality of capacitive elements and the first terminal.

5. The capacitance detection circuit of claim 4, wherein the second driving unit is configured to be able to independently apply the high voltage and the low voltage to a second side of each of the plurality of capacitive elements.

6. The capacitance detection circuit of claim 4, wherein the plurality of capacitive elements are Metal-Insulator-Metal (MIM) capacitor, the reference capacitor at least comprises a portion disposed at a region overlapping with an integrated region of a transistor element.

7. The capacitance detection circuit of claim 1, wherein the capacitance detection circuit is integrated on one semiconductor integrated circuit.

8. An input device, comprises:
    a panel comprising a sensor electrode, wherein an electrostatic capacitance of the sensor electrode changes when a position proximal to the sensor electrode is touched by a user; and
    the capacitance detection circuit of claim 1, connected to the sensor electrode.

* * * * *